United States Patent [19]
Bettman

[11] Patent Number: 6,148,435
[45] Date of Patent: Nov. 14, 2000

[54] OPTIMIZED PROGRAMMING/ERASE PARAMETERS FOR PROGRAMMABLE DEVICES

[75] Inventor: Roger Bettman, Los Altos, Calif.

[73] Assignee: Cypress Semiconductor Corporation, San Jose, Calif.

[21] Appl. No.: 08/998,090

[22] Filed: Dec. 24, 1997

[51] Int. Cl.[7] ............................ G06F 17/50; G11C 16/02; G11C 17/00
[52] U.S. Cl. ...................................... 716/16; 716/2; 716/4; 365/185.19; 365/185.29; 365/96
[58] Field of Search ........................... 395/500.02–500.19; 365/185.17, 185.19, 185.3–185.33, 96; 716/1–21

[56] References Cited

U.S. PATENT DOCUMENTS

| | | | |
|---|---|---|---|
| 5,257,225 | 10/1993 | Lee | 365/185.09 |
| 5,268,870 | 12/1993 | Harari | 365/185.09 |
| 5,272,388 | 12/1993 | Bakker | 327/525 |
| 5,397,939 | 3/1995 | Gordon et al. | 326/38 |
| 5,428,568 | 6/1995 | Kobayashi et al. | 365/185.24 |
| 5,490,109 | 2/1996 | Salmon | 365/185.17 |
| 5,499,191 | 3/1996 | Young | 716/17 |
| 5,532,959 | 7/1996 | Ninomiya et al. | 365/185.3 |
| 5,621,685 | 4/1997 | Cernea et al. | 365/185.18 |
| 5,661,412 | 8/1997 | Chawla et al. | 326/38 |
| 5,729,489 | 3/1998 | Fazio et al. | 365/185.03 |
| 5,734,868 | 3/1998 | Curd et al. | 716/5 |
| 5,777,887 | 7/1998 | Marple et al. | 716/4 |
| 5,815,404 | 9/1998 | Goetting et al. | 716/16 |
| 5,873,113 | 2/1999 | Rezvani | 711/103 |
| 5,880,996 | 3/1999 | Roohparvar | 365/185.33 |
| 5,889,701 | 3/1999 | Kang et al. | 365/185.18 |
| 5,901,194 | 5/1999 | Chevallier | 377/20 |

*Primary Examiner*—Paul R. Lintz
*Assistant Examiner*—Phallaka Kik
*Attorney, Agent, or Firm*—Wagner, Murabito & Hao LLP

[57] ABSTRACT

One or more optimized programming or erase parameters is (are) determined for a programmable device and that parameter (or those parameters) is (are) stored in the programmable device. When the programmable device is to be programmed or erased, the optimized parameter (or parameters) is (are) read from the programmable device and used in the programming or erase process.

22 Claims, 3 Drawing Sheets

OPTIMIZED PROGRAMMING/ERASE PARAMETERS FOR PROGRAMMABLE DEVICES

FIELD OF THE INVENTION

The present invention relates generally to programmable devices and, more particularly, to the programming and erasing of such devices.

BACKGROUND

Programmable devices such as electrically erasable programmable read only memories (EEPROMs), flash memories, programmable logic devices (PLDs), complex programmable logic devices (CPLDs), programmable array logic (PAL), field programmable gate arrays (FPGAs), etc., typically include non-volatile memory elements which can be programmed or erased under the control of appropriate programming or erase voltages. When programming or erasing such devices, the programming or erase voltage is typically applied to the non-volatile memory element for a period of time (a programming or erase pulse width) sufficient to achieve the desired programming or erasing of the memory cell. In the past, it was common to use a fixed programming or erase pulse width, e.g., as may be specified by a manufacture of the programmable device.

FIG. 1 illustrates a conventional programming operation 100 for a programmable device. The operation begins at step 102 where the address of the location to be programmed is loaded into the programming unit. Then, at step 104, that location is programmed according to the fixed pulse width, e.g., as may be specified by the manufacture of the programmable device. The programming step is verified at step 106. During verification, the addressed location is checked to determine whether programming was successful. If so, the check is made at step 108 to determine whether this was the last location in the programmable device to be programmed. When all such locations have been programmed, the process quits at step 110. If an attempted programming of a particular location was not successful, then at step 112, a check is made to determine whether the programming operation has exceeded a predetermined number of attempts to program that location. If not, another attempt is made to program the location according to the fixed pulse width. If, after several attempts, the location still has not been programmed, the programmable device fails the programming operation at step 114.

Conventional programming methods, such as that described above, typically fail to account for process variations among different lots of programmable devices. As a result, the fixed programming pulse width may be inadequate to assure programming of all locations in the programmable device. Or, the fixed programming pulse width may exceed the time necessary to adequately program the non-volatile memory cells. Either case presents a problem. For example, where the programming pulse width is not long enough, otherwise useful devices may be rejected because they fail repeated programming attempts. Alternatively, where the programming pulse width is to long, repeated programming and erase operations may cause early failure of the memory cells (e.g., due to oxide break down in the presence of strong electric fields caused by the programming and/or erase voltages). Thus, the use of fixed programming parameters (such as pulse widths) for programmable devices presents a less than ideal solution.

SUMMARY OF THE INVENTION

The present invention provides a optimized programming or erase parameter for a programmable device. For one embodiment, after manufacture, but prior to shipping, the optimized programming or erase parameter(s) is (are) determined for the programmable device and that parameter (or those parameters) is (are) stored in the programmable device. When the programmable device is to be programmed or erased, the optimized parameter (or parameters) is (are) read from the programmable device and used in the programming or erase process.

In a further embodiment, the present invention provides a method which includes storing an optimized parameter for a programmable device within the programmable device. The method may further include programming or erasing the programmable device according to the optimized parameter. The optimized parameter may be a pulse width.

In a further embodiment, the method may include reading an optimized parameter from the programmable device and programming or erasing the programmable device according to the optimized parameter. The optimized parameter may be a pulse width.

In yet another embodiment, a programmable device has stored therein an optimized programming and/or erase parameter, such as a programming and/or erase pulse width.

BRIEF DESCRIPTION OF THE DRAWINGS

The present invention is illustrated by way of example, and not limitation, in the figures of the accompanying drawings in which.

DETAILED DESCRIPTION

The present invention provides a optimized programming or erase parameter for a programmable device. After manufacture, but prior to shipping, the optimized programming or erase parameter is determined for the programmable device and that parameter (or parameters) is (are) stored in the programmable device. When the programmable device is to be programmed or erased, the optimized parameter (or parameters) is (are) read from the programmable device and used in the programming or erase process.

In one embodiment, the present invention provides a method which includes storing an optimized programming parameter for a programmable device within the programmable device. The method may further include programming the programmable device according to the optimized programming parameter. The programming parameter may be a programming pulse width.

In a further embodiment, the method may include storing an optimized erase parameter within the programmable device. The programming and erase parameter may be the same parameter, for example an optimized pulse width. Where an optimized erase parameter is used, the optimized erase parameter may be read prior to an erase operation and the erase operation may then be performed according to that optimized parameter.

In yet a further embodiment, a programmable device has stored therein an optimized parameter, such as a programming or erase parameter (e.g., a pulse width and/or a voltage level).

Figure 1:
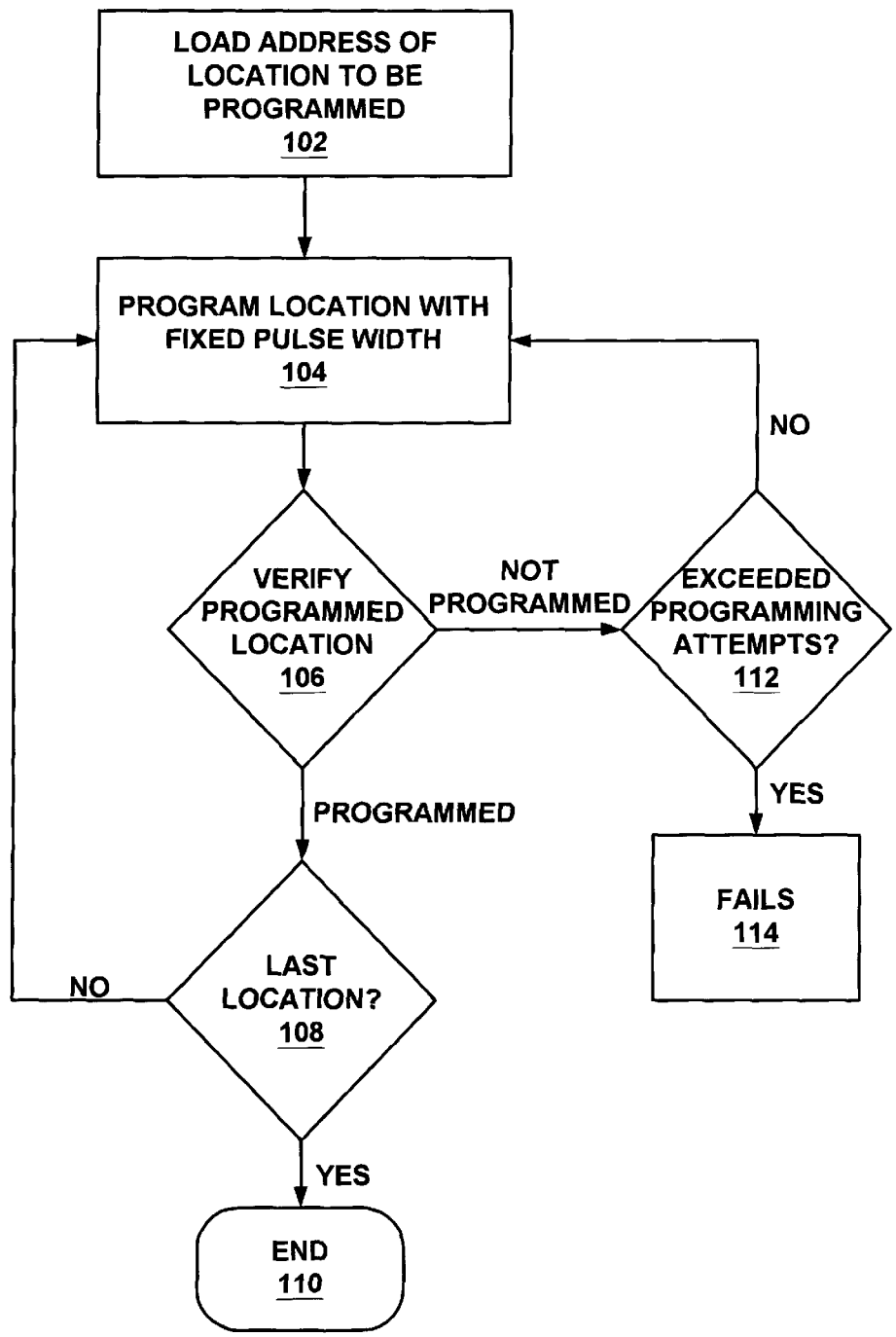
FIG. 1 illustrates an conventional programming operation for a programmable device using a fixed programming pulse width.
Figure 2:
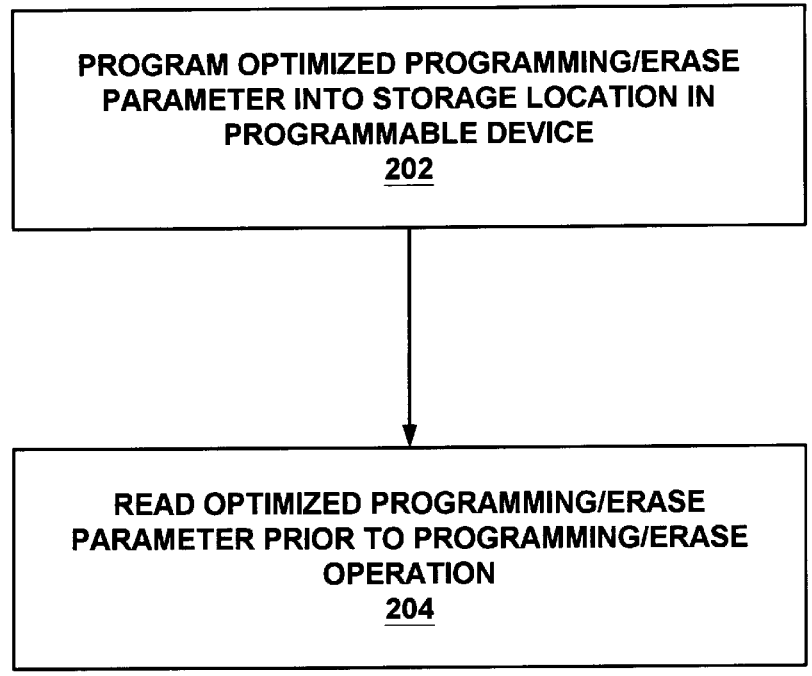
FIG. 2 illustrates one embodiment of the present invention wherein optimized programming and/or erase parameters are programmed into a programmable device.

FIG. 2 illustrates one embodiment of the present invention as a routine 200 for optimizing the programming and/or erasing of a programmable device. At step 202, one or more optimized programming and/or erase parameters for the programmable device are stored in appropriate storage locations (e.g., registers or other memory locations) within the programmable device. Such storing is typically performed prior to shipping the programmable device to customers, however, in some cases the storing may be performed after a programmable device has been received by a customer. The optimized programming and/or erase parameters, e.g., which may be pulse widths, may be determined by the manufacturer of the programmable device (or in some cases by the customer who ultimately uses the programmable device). Such a determination may be made, for example, by testing various programming and/or erase parameters with randomly selected units of a lot of programmable devices. When optimized parameters have been determined, each of the programmable devices of the tested batch or lot may be programmed with these parameters prior to shipping.

At step 204, prior to programming or erasing the programmable device, the optimized programming and/or erase parameters are read by appropriate programming and/or erasing units and the programmable device is then programmed or erased according to the optimized parameter(s). Minor modifications to the software and/or firmware of conventional programming devices may be required to allow these devices to read the optimized programming and/or erase parameters prior to beginning a programming or erase operation. For some embodiments, the optimized programming and/or erase parameter(s) may include a pulse width.

Figure 3:
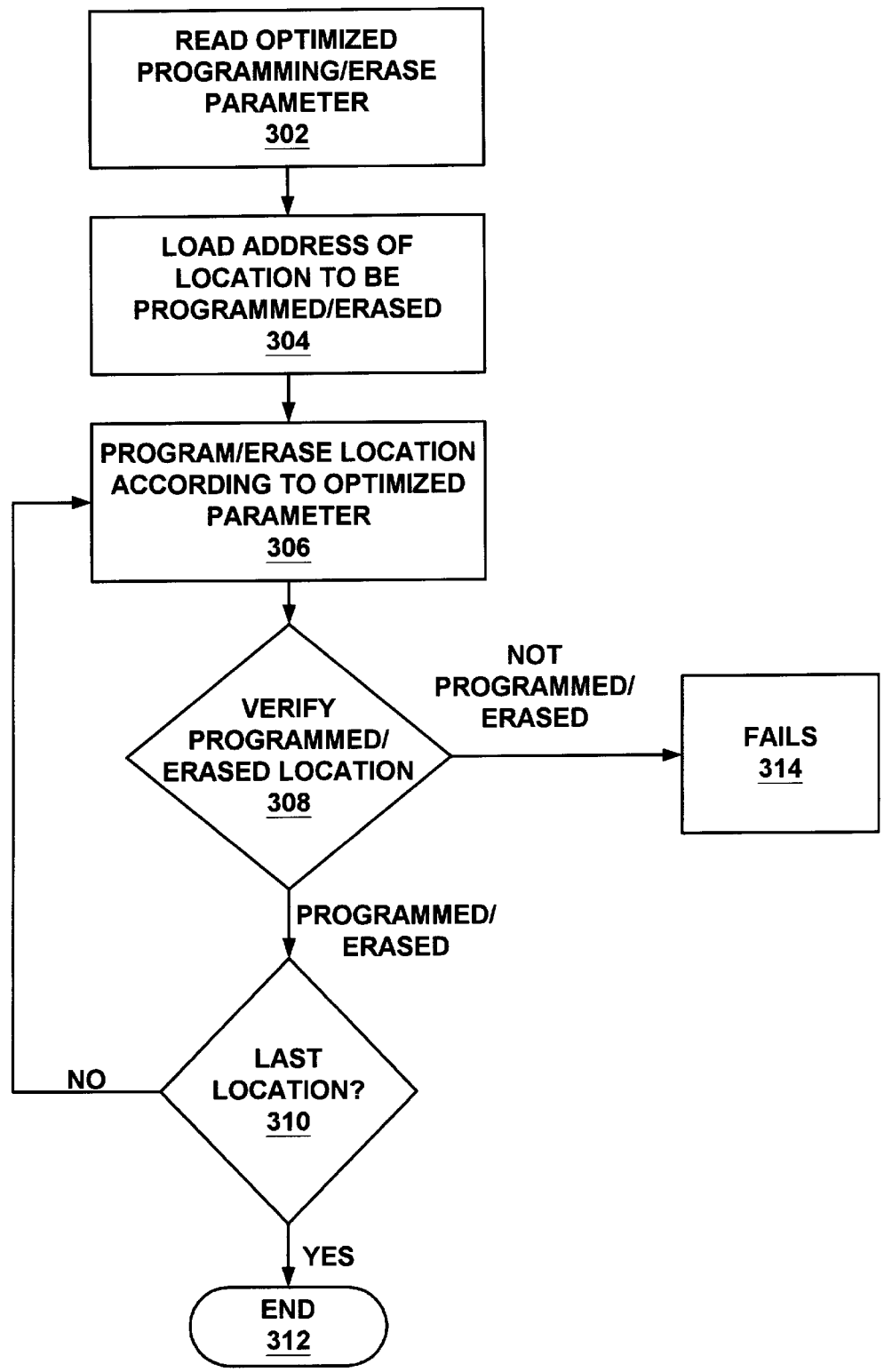
FIG. 3 illustrates an exemplary routine for utilizing a stored optimized programming and/or erase parameter according to an embodiment of the present invention.

FIG. 3 illustrates a routine 300 for programming and/or erasing a programmable device according to one embodiment of the present invention. At step 302, the optimized programming and/or erase parameter(s) (e.g., a pulse width) is (are) read from the programmable device. The optimized parameter(s) may have been previously stored prior to shipping the programmable device. Once the optimized parameter(s) has (have) been read, at step 304 the address of the location(s) to be programmed or erase is (are) loaded. It should be appreciated that step 304 may be carried out prior to step 302 in some embodiments. When the address of the location(s) to be programmed or erased has (have) been loaded, the programming or erase operation is conducted at 306. This operation is conducted according to the optimized parameter from step 302. In the case of a programming operation, a programming voltage may be applied for a period of time corresponding to an optimized programming pulse width stored in and read from the programmable device. In a case of a erase operation, an appropriate erase voltage may be applied for a period of time equivalent to an optimized erase pulse width stored in and read from the programmable device. In other embodiments, a variety of optimized programming and/or erase parameters may have been read at step 302, for example, optimized voltages and pulse widths. In such a case, each of these optimized parameters may be utilized at step 306.

When the programming or erase operation has been completed, the programming or erase operation is verified at step 308. If the verification determines that the programming or erase operation was successful, a check is made at step 310 to determine if this was the last such operation required. Multiple programming and/or erase operations may be performed until all of the locations to be programmed and/or erased have been successfully programmed and/or erased. When all such locations have been verified, the process quits at step 312.

If any of the locations to be programmed or erased were not successfully so programmed or erased, the part may fail the programming or erase operation at step 314. For this embodiment of the present invention, no looping operation to attempt additional programming or erasing of an addressed location is carried out. Since the use of optimized programming and/or erase parameters should have accomplished the desired programming or erase operation, a failure likely represents a true failure of the programmable device and the part should not be used. In other embodiments, it may be desirable to provide multiple attempts to complete the programming or erasing of a particular location, for example, where there is reason to suspected that the programming or erase operation may have been terminated prematurely (e.g., due to a power failure or other event).

The present methods, especially where branches in the programming/erase operation loop have been eliminated, ease the overall burden on the software for such operations. Thus, faster programming and/or erase times may be experienced. The present methods also allow a manufacturer to tailor pulse widths and/or other parameters (e.g., voltage levels) for programming or erase operations for individual programmable devices or lots of devices. Such methods may be especially useful for electrically erasable programmable read only memory cells and/or flash memory cells of programmable devices where successive programming and /or erase pulses must typically be longer than a first programming or erase pulse, in order to achieve programming or erasing of the cells. For such devices, a record could be kept (e.g., stored in the programmable device in an appropriate register or other memory location) of the number of times a particular device has been subjected to programming and/or erase cycles. Then, an appropriate (and previously stored, e.g., at the time of manufacture or even at the time of ultimate customer use) optimized programming and/or erase parameter could be read from one of a number of storage locations within the programmable device, based on the cycle number stored in the programmable device. In other words, different optimized programming and/or erase parameters may be stored at different locations within the programmable device and appropriate ones of these different programming and/or erase parameters selected and used at various times during the life cycle of programmable device.

Thus, a scheme for optimized programming and/or erase parameters for programmable devices has been described. Although discussed with reference to certain illustrated embodiments, the present invention should not be limited thereby. Instead, the present invention should only be measured in terms of the claims which follow.

What is claimed is:

1. A method, comprising:
    determining an optimized parameter for a programmable device;
    storing the optimized parameter for the programmable device within the programmable device, wherein the optimized parameter is adapted for programming a storage location of the programmable device without requiring additional programming attempts on the storage location.

2. The method of claim 1 wherein the optimized parameter comprises a programming parameter for the programmable device.

3. The method of claim 2 further comprising programming the programmable device according to the optimized programming parameter.

4. The method of claim 3 wherein the optimized programming parameter comprises a programming pulse width.

5. The method of claim 4 further comprising determining the programming pulse width prior to the step of storing.

6. The method of claim 3 further comprising reading the optimized programming pulse width prior to the step of programming.

7. The method of claim 3 further comprising verifying the programming of the programmable device after the step of programming.

8. The method of claim 7 wherein the steps of programming and verifying are repeated for a plurality of addressable locations within the programmable device.

9. The method of claim 1 wherein the optimized parameter comprises an optimized erase parameter, wherein the optimized erase parameter is adapted for erasing a second storage location of the programmable device without requiring additional erasing attempts on the second storage location.

10. The method of claim 1 further comprising storing an optimized erase parameter within the programmable device.

11. The method of claim 10 further comprising erasing a location in the programmable device according to the optimized erase parameter.

12. The method of claim 11 further comprising reading the optimized erase parameter prior to the step of erasing.

13. The method of claim 12 further comprising verifying the erasing of the location after the step of erasing.

14. The method of claim 10 further comprising determining the optimized erase parameter prior to the step of storing the optimized erase parameter.

15. A method comprising:

reading an optimized parameter for a programmable device stored within the programmable device;

programming a first storage location of the programmable device according to the optimized parameter; and verifying that the first storage location is successfully programmed without requiring additional programming attempts on the first storage location.

16. The method of claim 15 further comprising erasing a second storage location of the programmable device according to the optimized parameter; and verifying that the first storage location is successfully erased without requiring additional erasing attempts on the second storage location.

17. The method of claim 16 wherein the optimized parameter is a pulse width.

18. The method of claim 16 wherein the optimized parameter is a voltage level.

19. A programmable device having stored therein an optimized programming parameter for use by a programming device in performing a method comprising:

programming a storage location of the programmable device according to the optimized parameter; and verifying that the storage location is successfully programmed without requiring additional programming attempts on the storage location.

20. The programmable device of claim 19 wherein the optimized programming parameter is a pulse width.

21. A programmable device having stored therein an optimized erase parameter for use by a programming device in performing a method comprising:

erasing a storage location of the programmable device according to the optimized parameter; and verifying that the storage location is successfully erased without requiring additional programming attempts on the storage location.

22. The programmable device of claim 21 wherein the optimized erase parameter is a pulse width.

* * * * *